(12) United States Patent
Lanzerotti et al.

(10) Patent No.: US 6,441,462 B1
(45) Date of Patent: Aug. 27, 2002

(54) SELF-ALIGNED SIGE NPN WITH IMPROVED ESD ROBUSTNESS USING WIDE EMITTER POLYSILICON EXTENSION

(75) Inventors: Louis D. Lanzerotti, Burlington; Steven H. Voldman, South Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,016

(22) Filed: Jul. 10, 2001

(51) Int. Cl.$^7$ ............................................. H01L 27/082
(52) U.S. Cl. ................... 257/576; 257/588; 257/591; 257/593
(58) Field of Search ............................... 257/578–588, 257/591–593, 565, 573, 574–576

(56) References Cited

U.S. PATENT DOCUMENTS

| | | | |
|---|---|---|---|
| 5,140,400 A | * 8/1992 | Morishita | 357/34 |
| 5,323,032 A | * 6/1994 | Sato et al. | 257/198 |
| 5,516,708 A | 5/1996 | Li et al. | 437/31 |
| 5,665,616 A | 9/1997 | Kimura et al. | 438/234 |
| 5,904,536 A | 5/1999 | Blair | 438/366 |
| 5,962,880 A | * 10/1999 | Oda et al. | 257/198 |
| 6,066,520 A | 5/2000 | Suzuki | 438/202 |
| 6,100,124 A | * 8/2000 | Iwamoto | 438/202 |

FOREIGN PATENT DOCUMENTS

JP 11-150238 * 6/1999 ........... H01L/27/10

* cited by examiner

*Primary Examiner*—Steven Loke
*Assistant Examiner*—Ori Nadav
(74) *Attorney, Agent, or Firm*—Scully, Scott, Murphy & Presser; Mark F. Chadurjian

(57) ABSTRACT

A semiconductor bipolar transistor structure having improved electrostatic discharge (ESD) robustness is provided as well as a method of fabricating the same. Specifically, the inventive semiconductor structure a semiconductor structure comprises a bipolar transistor comprising a lightly doped intrinsic base; a heavily doped extrinsic base adjacent to said intrinsic base, a heavily doped/lightly doped base doping transition edge therebetween, said heavily doped/lightly doped base doping transition edge defined by an edge of a window; and a silicide region extending on said extrinsic base, wherein said silicide region is completely outside said window.

18 Claims, 5 Drawing Sheets

US 6,441,462 B1

SELF-ALIGNED SIGE NPN WITH IMPROVED ESD ROBUSTNESS USING WIDE EMITTER POLYSILICON EXTENSION

BACKGROUND OF THE INVENTION

FIELD OF THE INVENTION

The present invention relates to semiconductor bipolar devices, and more particularly to a silicon germanium (SiGe) bipolar transistor having improved electrostatic discharge (ESD) robustness.

Significant growth in both high-frequency wired and wireless markets has introduced new opportunities where compound semiconductors have unique advantages over bulk complementary metal oxide semiconductor (CMOS) technology. With the rapid advancement of epitaxial-layer pseudomorphic SiGe deposition processes, epitaxial-base SiGe heterojunction bipolar transistors have been integrated with main stream advanced CMOS development for wide market acceptance, providing the advantages of SiGe technology for analog and radio frequency (RF) circuitry while maintaining the full utilization of the advanced CMOS technology base for digital logic circuitry.

SiGe heterojunction bipolar transistor devices are replacing silicon bipolar junction devices as the primary element in all analog applications. With increased volume and growth in the applications that use SiGe heterojunction bipolar transistors for external circuitry, ESD robustness is needed. This is especially the case in RF applications such as mobile phone use, where high-transistor speeds and high-frequency responses are needed. As the frequency responses of such devices increase, the loading effect on the transistor, which may lead to excessive noise and distortion, also increases.

Presently, there are few SiGe heterojunction bipolar transistors for use in RF applications and other applications which require high-operating speeds and high frequencies that have satisfactory ESD robustness. In such devices, the base is typically connected to an external pad and is thus vulnerable to both positive and negative HBM pulses.

A typical prior art SiGe heterojunction bipolar transistor is shown, for example, in FIG. 1. Specifically, the structure shown in FIG. 1 comprises semiconductor substrate 10 having subcollector region 14 formed thereon. Isolation regions 12, collector region 16 and pedestal implant region 17 are formed in a Si-containing layer that is formed atop subcollector region 14.

The illustrated prior art structure also includes SiGe layer 18 which includes polycrystalline regions 18b abutting a single-crystal region 18a. The polycrystalline regions are formed predominately over the isolation regions, whereas the single-crystal region is formed over the collector region. Note the dotted lines (labeled as 20) in SiGe layer 18 represent the facet region of the SiGe layer. The facet region is the boundary region wherein the SiGe layer changes from polycrystalline to single-crystal. As one skilled in the art is aware, the facet region may vary somewhat from the drawings of the present invention. For example, facet region 20 may be directed towards or away from the emitter. Note also that a portion of the SiGe layer and the Si-containing layer atop the subcollector include extrinsic base implant regions 23.

The prior art structure also includes patterned insulator 22 formed on SiGe layer 18, the patterned insulator has an opening which exposes portions of the single-crystal SiGe region. Doped polysilicon 24 is then formed on said patterned insulator and is in contact with the single-crystal SiGe region through the above-mentioned opening. The structure also includes silicide regions 28 that are formed on the SiGe layer and in contact with the polysilicon emitter source edge. Note during the annealing step used in forming the silicide regions, emitter diffusion region 26 is formed in the single-crystal SiGe region. Due to the encroachment between the silicide regions and the emitter junction (i.e., polysilicon region 24), the device may suffer from ESD damage.

In view of the above problems with prior art SiGe heterojunction bipolar transistors, there is a continued need for fabricating new and improved SiGe heterojunction bipolar transistors that do not significantly suffer from ESD damage.

BRIEF SUMMARY OF THE INVENTION

One object of the present invention is to provide an ESD robust semiconductor heterojunction bipolar transistor that is capable of operating efficiently at high-operating speeds and high frequencies.

Another object of the present invention is to provide an ESD robust semiconductor heterojunction bipolar transistor that has a low-base resistance thereby improving the performance of the device.

A further object of the present invention is to provide an ESD robust semiconductor heterojunction bipolar transistor in which the salicide regions are moved farther away from the base-emitter junction area and farther away from the facet transition between emitter polysilicon and single-crystal edge.

A yet further object of the present invention is to provide an ESD robust semiconductor heterojunction bipolar transistor that does not include additional ballasting resistor elements.

These and other objects and advantages are achieved in the present invention by using the emitter polysilicon shape to move the salicide edge from the region of the emitter-base junction and farther away from the extrinsic-base implant "link-resistance" edge. The extrinsic base is defined herein as the base region prior to the facet.

In one embodiment of the present invention, a semiconductor structure is provided that comprises:

a bipolar transistor comprising a lightly doped intrinsic base;

a heavily doped extrinsic base adjacent to said intrinsic base, a heavily doped/lightly doped base doping transition edge therebetween, said heavily doped/lightly doped base doping transition edge defined by an edge of a window; and a silicide region extending on said extrinsic base, wherein said silicide region is completely outside said window.

The term "lightly doped intrinsic base" denotes a base region that is doped with an ion using a dopant dosage of from about 1E11 cm$^{-2}$ to about 1E14 cm$^{-2}$. More preferably, the lightly doped intrinsic base is doped using a dopant dosage of about 1E13 cm$^{-2}$ so that a concentration of about 1E19 cm$^{-3}$ is obtained.

The term "heavily doped extrinsic base" denotes a base region that is doped with an ion using a dopant dosage of from about 1E15 cm$^{-2}$ to about 1E16 cm$^{-2}$. More preferably, the heavily doped extrinsic base is doped using a dopant dosage of about 1E15 cm$^{-2}$ so that a concentration of about 1E20 cm$^{-3}$ is obtained.

In another embodiment of the present invention, the inventive semiconductor structure comprises:

a bipolar transistor comprising an extrinsic base having a polycrystalline/single crystal facet; and a silicide region on said extrinsic base, wherein said silicide region extends extensively on said polycrystalline side of said facet.

In yet another embodiment of the present invention, the semiconductor structure comprises:

a bipolar transistor comprising an emitter;

an isolation surrounding said emitter, said isolation having an inner edge;

an extrinsic base extending on said isolation; and a silicide region on said extrinsic base, wherein said silicide region extends exclusively outside said inner edge.

In a further embodiment of the present invention, a semiconductor heterojunction bipolar transistor structure is provided that comprises:

a substrate of a first conductivity-type having a subcollector of a second conductivity-type present therein, said substrate including isolation regions formed atop said subcollector;

a SiGe-containing layer formed on said substrate including said isolation regions, wherein said SiGe-containing layer comprises a single-crystal SiGe-containing region abutted by polycrystalline SiGe-containing regions, said single-crystal and polycrystalline regions are separated by a facet region;

a patterned emitter formed on said SiGe-containing layer, said patterned emitter including an insulator, doped polysilicon and an emitter diffusion region; and metal salicide regions formed on said polycrystalline SiGe-containing regions above said isolation regions, wherein said metal salicide regions are displaced from said facet region and from said emitter diffusion region.

In one embodiment of the present invention, the patterned emitter (i.e., patterned doped polysilicon and insulator) extends beyond the edges of the isolation regions. In yet other embodiment of the present invention, the patterned emitter is not formed over any portion of the isolation regions.

The present invention is also directed to a method for providing the above-described structure. Specifically, the method of the present invention includes the steps of:

(a) forming a SiGe-containing film on a surface of a structure which includes at least a subcollector region, said SiGe-containing film comprises a single-crystal SiGe-containing region abutted by polycrystalline SiGe-containing regions, said single-crystal and polycrystalline regions are separated by a facet region;

(b) forming an insulator on said SiGe-containing film;

(c) providing an opening in said insulator so as to expose a portion of said single-crystal SiGe-containing region;

(d) forming a doped polysilicon layer over the insulator including in said opening so as to cover said exposed portion of said single-crystal SiGe-containing region;

(e) patterning said doped polysilicon layer and said insulator so as to at least expose portions of said polycrystalline SiGe-containing regions that are formed on said isolation regions; and (f) saliciding said exposed portions of said polycrystalline SiGe-containing regions above said isolation regions forming a metal salicide region therein, wherein during said saliciding dopant from said doped polysilicon diffusions into the single-crystal region forming an emitter diffusion region, and wherein each of said metal salicide regions is displaced from said facet region and from said emitter diffusion region.

In one embodiment, the patterning step forms an emitter region in which the doped polysilicon extends beyond the edges of the isolation regions. In other embodiment of the present invention, the patterning step forms an emitter region in which the doped polysilicon does not extend over any portion of the isolation regions. In this embodiment, the emitter polysilicon is not in contact with the metal salicide regions.

DETAILED DESCRIPTION OF THE INVENTION

Figure 1:
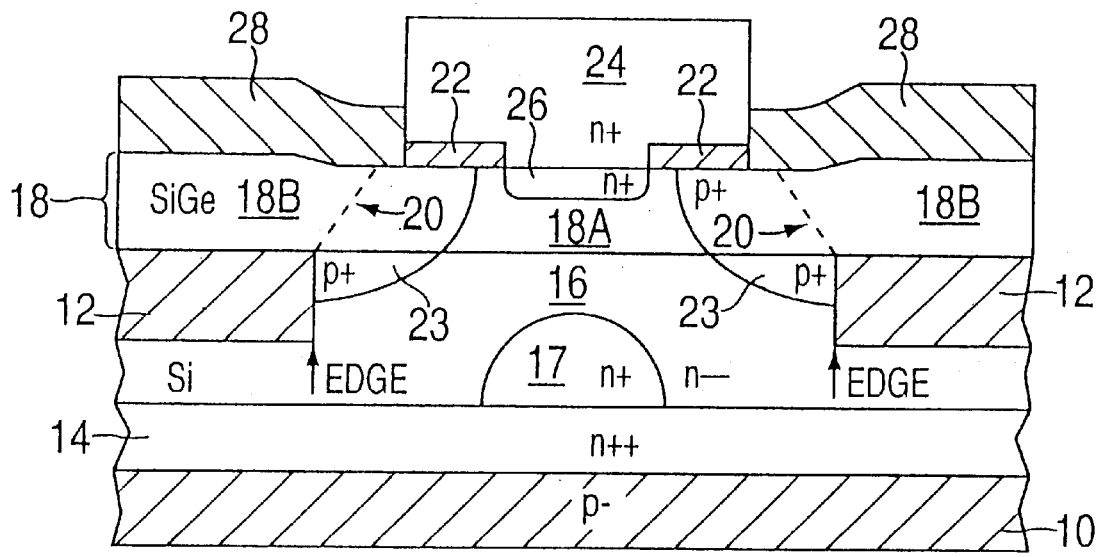
FIG. 1 is a cross-sectional view of a prior art semiconductor heterojunction bipolar transistor.

The present invention which is directed to an ESD robust semiconductor heterojunction bipolar transistor and a method of fabricating the same will now be described in greater detail by referring to the drawings that accompany the present application.

Figure 2:
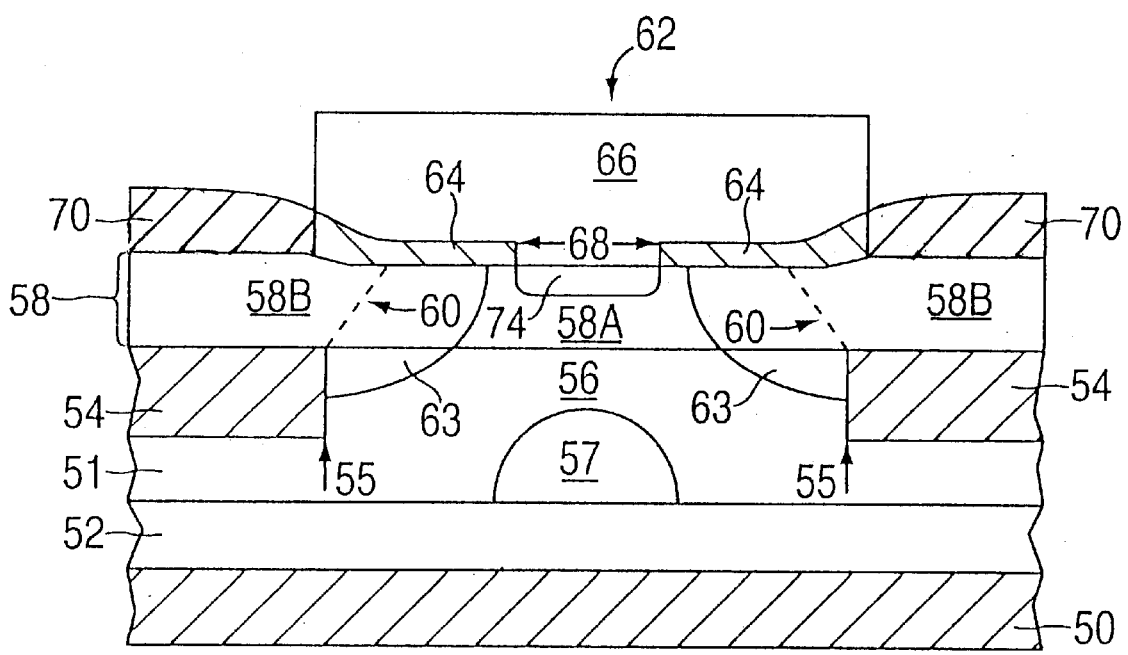
FIG. 2 is a cross-sectional view of the inventive semiconductor heterojunction bipolar transistor.

Reference is first made to FIG. 2 which is a cross-sectional view of one possible semiconductor bipolar structure that can be fabricated in the present invention. Specifically, the structure shown in FIG. 2 comprises substrate 50 of a first conductivity-type (P or N) having subcollector 52 of a second conductivity-type that is different from the first conductive-type formed thereon. Atop of subcollector 52 is a Si-containing layer 51 that includes isolation regions 54, collector region 56 and pedestal implant 57 which is located between two isolation regions. The inventive structure shown in FIG. 2 also includes SiGe-containing layer 58 formed on the Si-containing layer including said isolation regions. In accordance with the present invention, SiGe-containing layer 58 includes single-crystal SiGe-containing region 58*a* abutted by polycrystalline SiGe-containing regions 58*b*. Reference numeral 60 denotes the boundary, i.e., facet region, between single-crystal region and abutting polycrystalline regions. Note the facet region may vary somewhat from the drawings of the present invention and that extrinsic base implant regions 63 are formed in a portion of the SiGe-containing layer and a portion of the Si-containing layer 51.

Patterned emitter 62 which includes insulator 64 and doped polysilicon 66 is formed on SiGe-containing layer 58. Note that the patterned emitter includes emitter window region 68 wherein the doped polysilicon is in contact with the single-crystal SiGe-containing region. In accordance with the present invention, the polysilicon of the emitter is doped with a dopant that is opposite to the first conductivity-type dopant. Therefore, the present invention contemplates PNP bipolar transistors or NPN bipolar transistors.

The inventive structure illustrated in FIG. lso includes metal salicide regions 70 formed on polycrystalline SiGe-containing regions 58b above the isolation regions, but not on single-crystal SiGe-containing region 58a. Moreover, the metal salicide regions are displaced from edges 55 of the isolation regions. In the embodiment shown in FIG. 2, patterned emitter region 62 includes doped polysilicon 66 that extends beyond edges 55 of the isolation regions. Note reference numeral 74 refers to the emitter diffusion region that is formed in the single-crystal SiGe-containing region during formation of the metal salicide regions.

Figure 3:
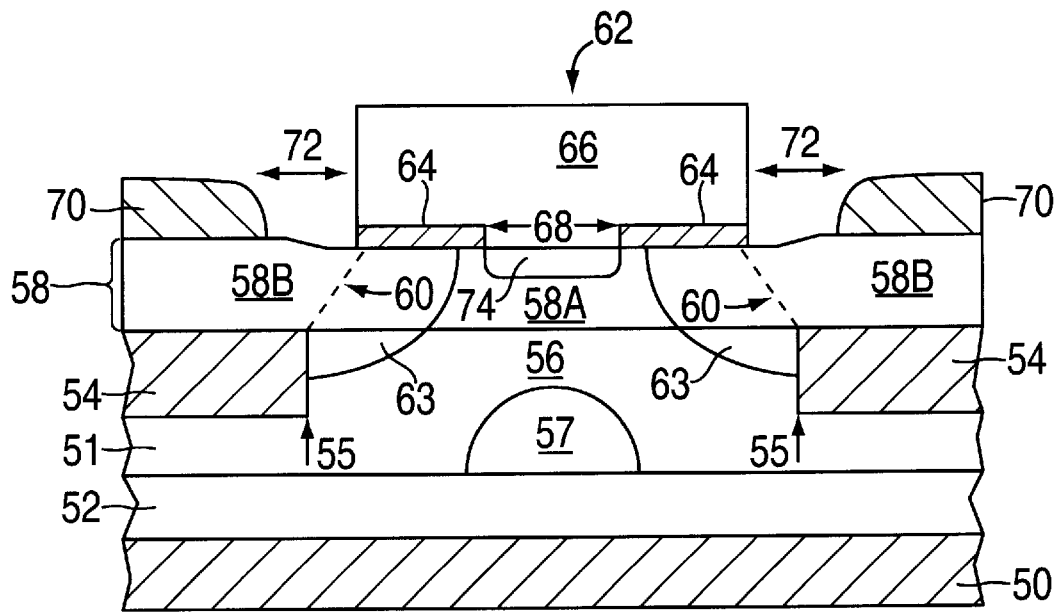
FIG. 3 is a cross-sectional view of an alternative semiconductor heterojunction bipolar transistor that can be provided by the present invention.

FIG. 3 shows an alternative semiconductor heterojunction bipolar transistor structure. This structure includes the same basic elements as in FIG. 2 and is similar to the structure shown previously except that patterned emitter region 62 does not include doped polysilicon 66 that extends beyond edges 55 of the isolation regions. Instead in the structure shown in FIG. 3, the patterned emitter is completely formed on the single-crystal Si-containing region and spaces 72 separate patterned emitter 62 from metal salicide regions 70 that are formed on polycrystalline SiGe-containing extrinsic base regions 58b above the isolation regions.

The inventive structures shown in FIGS. 2 and 3 have improved ESD protection compared with the prior art structure shown in FIG. 1. Specifically, in FIG. 2, the improved ESD protection is obtained by forming the extended emitter region and by displacing the metal salicide regions from edges 55 of isolation regions 54. Insofar as the structure of FIG. 3 is concerned, the improved ESD protection is obtained over the structure shown in FIG. 1 because of the distance between the metal salicide regions and the patterned emitter region.

The structures shown in FIGS. 2–3 are composed of conventional materials that are well known to those skilled in the art and conventional processing steps that also well known in the art are employed in forming the same. The method and materials used in forming the structure illustrated in FIG. 2 will now be described in more detail by referring to FIGS. 4A–4H, whereas the method used in forming the structure illustrated in FIG. 3 will follow hereinbelow. Before preceding, it is noted that the drawings show only a fragment of a semiconductor device, i.e., one bipolar device region, the present invention works in cases when other device regions are present and more than one bipolar device region can be formed using the method of the present invention.

Figure 4A:
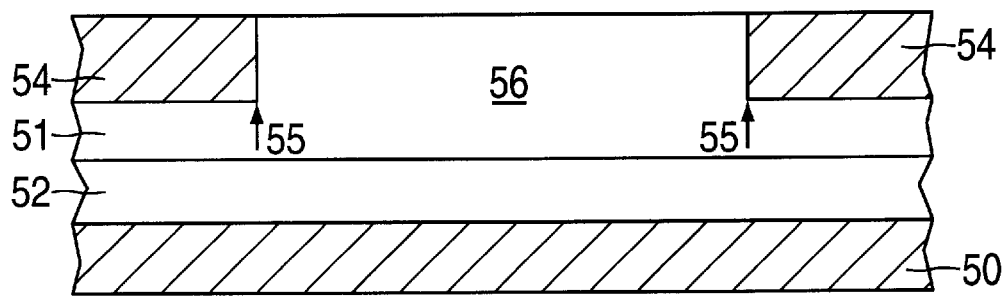
FIGS. 4A–4H are cross-sectional views of the inventive structure shown in FIG. 2 through various processing steps of the present invention.

Reference is first made to FIG. 4A which illustrates an initial structure employed in the present invention. Specifically, the initial structure shown in FIG. 4A includes substrate 50 having subcollector 52 formed thereon. Isolation regions 54 and collector region 56 are formed atop the subcollector region in Si-containing layer 51. Note the Si-containing layer may be part of the substrate or it can be an added Si-containing layer such as an epi-Si layer that is formed utilizing processes well known in the art.

In accordance with the present invention, substrate 50 is of a first conductivity-type (N or P) and it is typically composed of a Si-containing semiconductor material including, but not limited to: Si, SiGe, Si/Si, Si/SiGe and silicon-on-insulators (SOIs). The subcollector is of a second conductivity-type (N or P) that is different from the first conductivity-type and it is typically formed on the substrate by epitixial growth followed by ion implantation.

After formation of the subcollector region, isolation regions 54 are formed in the Si-containing layer using techniques well known to those skilled in the art. The isolation regions may be trench isolation or LOCOS (local oxidation of silicon). When trench isolation regions are employed, the trench isolation regions are formed by first providing trenches in Si-containing layer 51. This is achieved through conventional lithography and etching. The etched trenches are then lined with a conventional liner material and filled with a trench dielectric such as tetraethylorthosilicate (TEOS). If needed, the trench dielectric may be densified and/or planarized. When LOCOS isolation regions are employed, those isolation regions are formed by a conventional LOCOS process.

The collector region is then formed in Si-containing layer 51 by using conventional ion implantation so as to provide the structure shown in FIG. 4A. An ion implantation mask (not shown) is typically used in forming the collector region and the mask is typically removed after the implantation process.

Figure 4B:
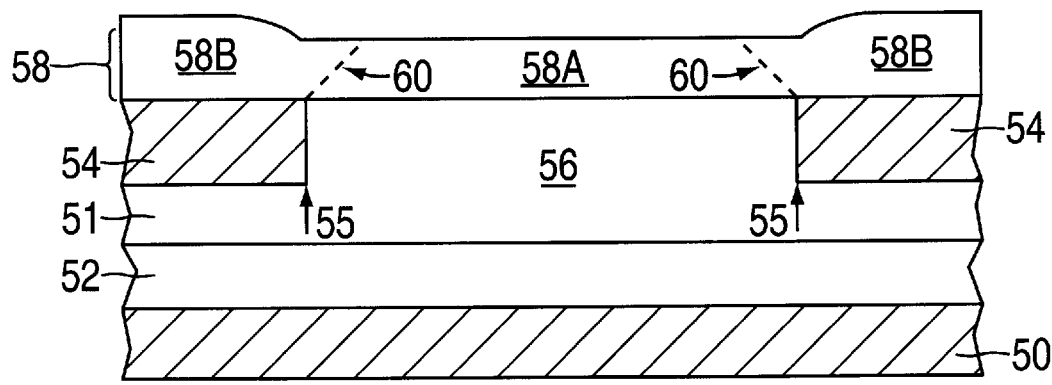

FIG. 4B illustrates the structure that is formed after SiGe-containing layer 58 is formed on the Si-containing layer including the isolation regions. The SiGe-containing layer is comprised of SiGe or SiGeC. In one highly preferred embodiment of the present invention, the SiGe-containing layer is comprised of SiGe. The SiGe-containing layer is formed utilizing a low temperature (about 550ïSC. or below) deposition process. Suitable low temperature deposition processes that can be employed in the present invention in forming the SiGe-containing layer include, but are not limited to: chemical vapor deposition (CVD), plasma-assisted CVD, atomic layer deposition (ALD), chemical solution deposition, ultra-high vacuum CVD and other like deposition processes.

It is noted that the deposition process used in forming SiGe-containing layer 58 is capable of simultaneously depositing a single-crystal SiGe-containing region and abutting polycrystalline SiGe-containing regions. In accordance with the present invention, the polycrystalline regions are formed predominately over the isolation regions and the single-crystal region is formed predominately on top of the collector region. The boundary between polycrystalline and single-crystal regions is shown in FIG. 4B as a dotted line and it is labeled as 60. Boundary 60 is referred to in the art as a facet region. The orientation of the facet region is a function of the underlying topography; therefore it may vary somewhat from that which is shown in the drawings.

Figure 4C:
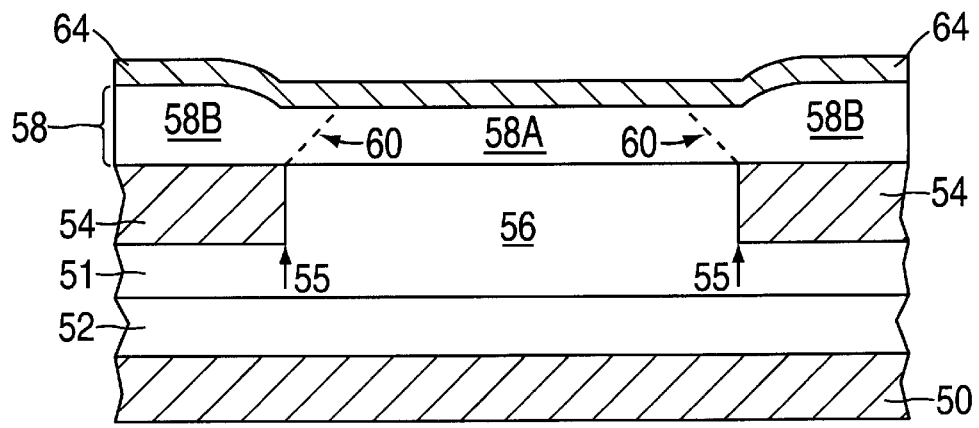

FIGS. 4C–4F show the steps that are used in defining the emitter region and forming a pedestal implant in the surface of the initial structure. Next, and as is illustrated in FIG. 4C, insulator 64 is formed on the surface of SiGe-containing layer 58 utilizing conventional deposition processes well known in the art. Suitable deposition processes include, but are not limited to: CVD, plasma-enhanced CVD, sputtering, chemical solution deposition and other like deposition processes. Insulator 64 may comprise a single insulator material, or it may include combinations of more than one insulator material, e.g., a dielectric stack. The insulator used in this step of the present invention thus may comprise an oxide, a nitride, oxynitride or combinations thereof.

Figure 4D:
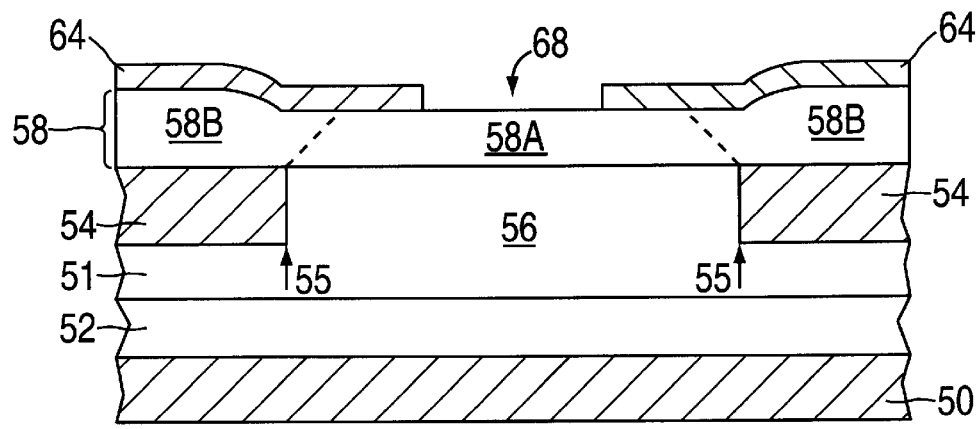

FIG. 4D shows the structure after opening 68 is formed in insulator 64. the opening is formed utilizing conventional lithography and etching such as RIE (reactive-ion etching). It should be noted that the emitter opening is formed above collector region 56 in the SiGe-containing film.

Next, dummy emitter stack layer 100 which comprises oxide layer 102 and nitride layer 104 is formed by successively depositing the oxide and nitride layers on the insulator layer 64 utilizing conventional deposition processes that are well known to those skilled in the art, e.g., CVD. Next, a photoresist, not shown, is applied to nitride layer 104, and the photoresist is thereafter patterned by conventional lithography. Next, the exposed layers of the dummy stack not containing the patterned photoresist is etched stopping on insulator 64. A conventional stripping process is then employed to remove the patterned photoresist. Sidewall spacers 105 are then formed on insulator layer 64 so as to cover any exposed sidewalls of dummy stack 100, See FIG. 4E.

Figure 4E:
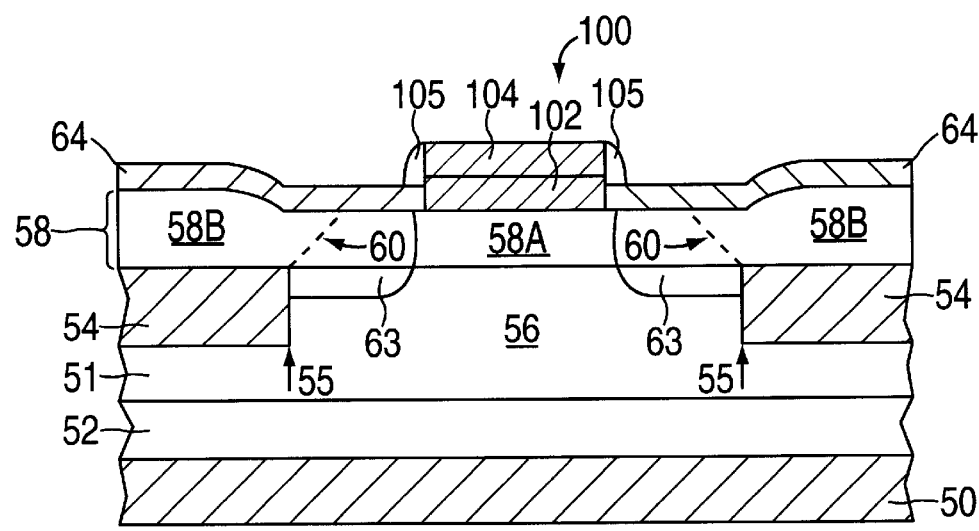
Figure 4F:
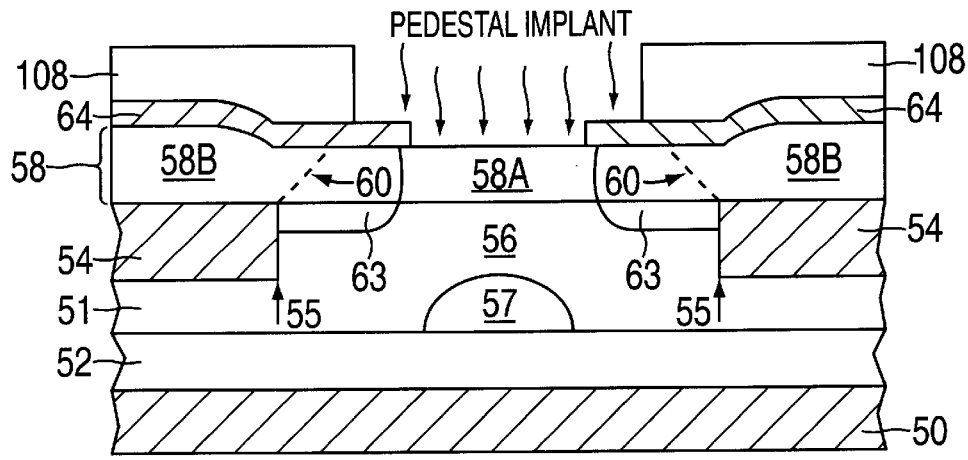

At this point of the invention process, extrinsic base implants regions 63 are formed in the structure as shown in FIG. 4E. This implant step includes the use of a conventional ion implantation process. Note that this implant uses sidewall spacers 105 as a means to separate extrinsic base implant from emitter diffusion.

Etching is then performed to remove dummy emitter stack 100 and sidewall spacers 105 exposing a portion of SiGe-containing layer 58. Patterned resist 108 is formed on portions of the sacrificial oxide layer and a pedestal implant is then performed utilizing a conventional ion implantation process well known to those skilled in the art. The pedestal implant region formed by this implant step is shown for example, in FIG. 4F. Following the formation of the pedestal implant, resist 108 is removed from the, structure. Note that at this point of the inventive process portions of insulator layer 64 outside the device region shown in the drawings may be removed utilizing conventional processes well known in the art.

Figure 4G:
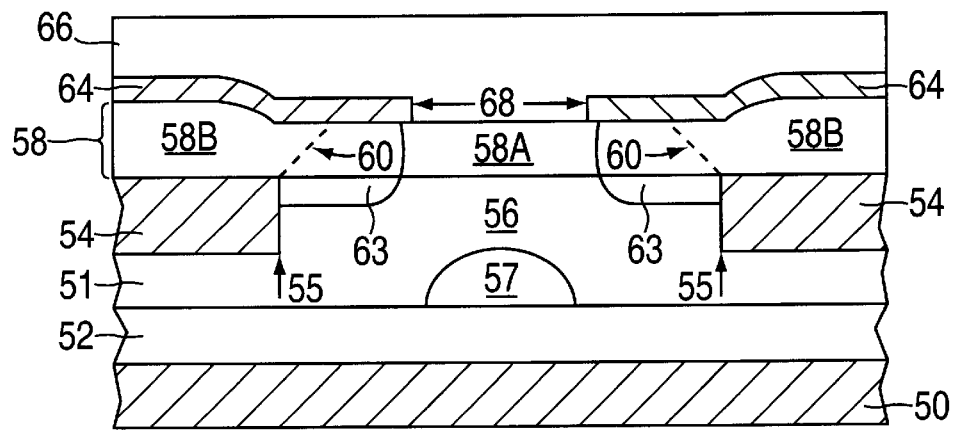

FIG. 4G shows the structure after a layer of emitter doped polysilicon 66 is formed over the insulator as well as in the opening. The doped polysilicon layer is formed utilizing any conventional in-situ doping deposition process that is well known in the art. As mentioned earlier, doped polysilicon is of the opposite conductivity-type as the substrate; i.e., opposite to the first conductivity-type.

Figure 4H:
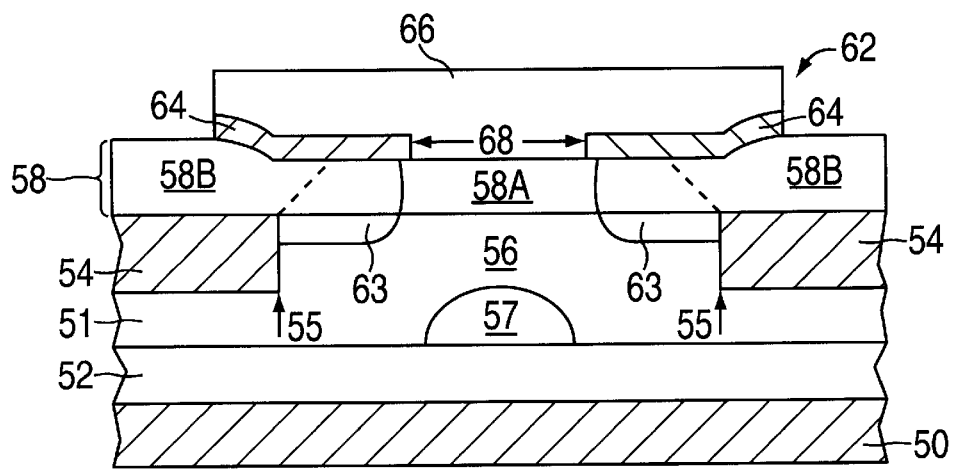

In FIG. 4H, the doped polysilicon layer and insulator are patterned using conventional lithography and etching forming patterned emitter region 62. The etching step may remove both the doped polysilicon and insulator at the same time or multiple etching steps may be employed in which the doped polysilicon is selectively etched and thereafter the insulator is selectively etched. Note that after etching, some portions of the underlying SiGe-containing layer are exposed.

Next, metal salicide regions 70 are formed on exposed SiGe-containing layer that are above the isolation regions, i.e., the polycrystalline regions of the SiGe-containing layer. This is achieved utilizing conventional salicidation processes well known in the art, including deposition of a refractory metal layer on said the exposed polycrystalline SiGe-containing regions; annealing the metal layer so as to form metallic salicide regions 70 on said polycrystalline regions; and removing any refractory metal not salicided in the annealing step. Examples of refractory metals include, but are not limited to: Ti, TiN, TiMo, TiNo and Co. Thus, the metal salicide regions may include Ti silicide or Co silicide, with preference given to Ti silicide. This step of the present invention results in the structure shown in FIG. 2. Note during the above-mentioned annealing step, dopant from the doped polysilicon diffuses into the single-crystal SiGe-containing region forming emitter diffusion region 74 therein.

Two important aspects of the structure shown in FIG. 2 are that the patterned emitter is extended beyond edges 55 of isolation regions 54 and that metal salicide regions are limited to areas that are above the isolation regions.

Figure 5A:
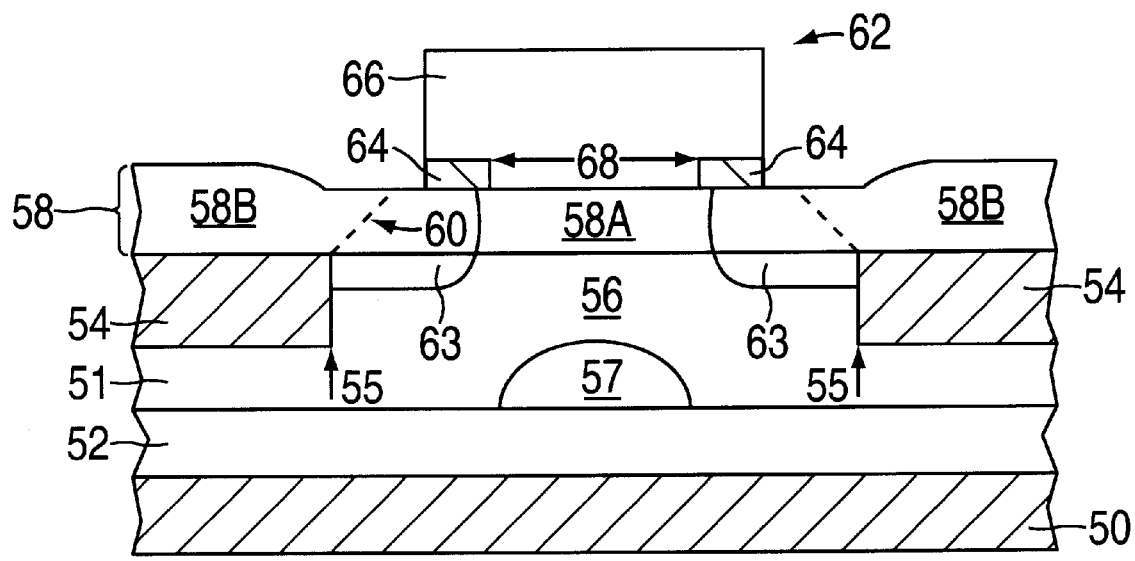
FIGS. 5A–5B are cross-sectional views of the alternative structure shown in FIG. 3 through various processing steps of the present invention.

The structure shown in FIG. 3 will now be described in greater detail. Specifically, the structure shown in FIG. 3 is formed by first conducting the same processing steps as shown in FIGS. 4A–4G. Next, as shown in FIG. 5A, patterned emitter 62 is formed utilizing conventional lithography and etching. Note that the mask (not shown) forms patterned emitter region 62 which is present only above the collector region 56.

Figure 5B:
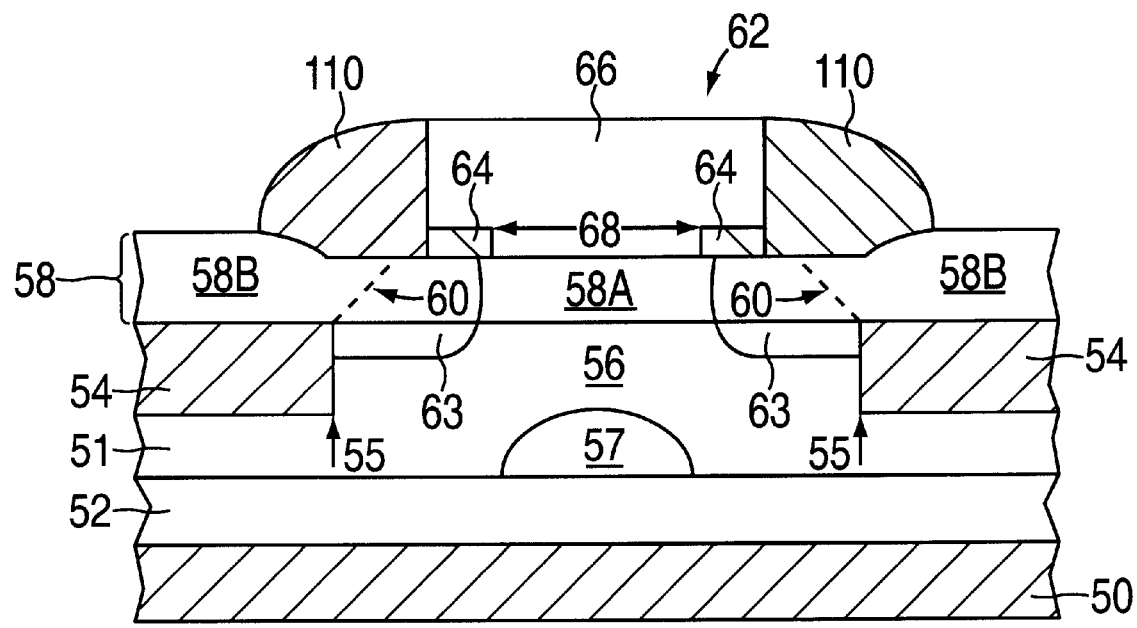

Next, and as shown in FIG. 5B, spacers 110 are formed using conventional deposition processes well known in the art so as to at least extend beyond edges 55 of isolation regions 54. The spacers are composed of an insulator such as an oxide or nitride and are typically, but not always, removed following the subsequent salicidation process. Specifically, the spacers are removed by utilizing an isotropic etching process. The final structure formed after conducting the above described salicidation step is shown, for example, in FIG. 3.

Note that in FIG. 3, the metal salicide regions are formed only above the isolation regions and that the patterned emitter is well displaced from edges 55 of the isolation regions. Note also that spaces 72, previously occupied by the spacers, separate the patterned emitter region from the metal salicide regions.

While the present invention has been particularly shown and described with respect to preferred embodiments thereof, it will be understood by those skilled in the art that the foregoing and other changes in forms and details may be made without departing from spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

What is claimed is:

1. A bipolar transistor comprising:
   a substrate having a subcollector located atop a surface of the substrate;
   a Si-containing layer present atop said subcollector, said Si-containing layer having isolation regions therein, each isolation region containing an inner edge;
   a SiGe-containing layer present atop said Si-containing layer, said SiGe-containing layer comprising a single-crystal SiGe-containing region and abutting polycrystalline SiGe-containing regions;
   a facet region between said single-crystal SiGe-containing region and each polycrystalline SiGe-containing region;
   a patterned emitter located above said single-crystal SiGe-containing region and a portion of each polycrystalline SiGe-containing region; and
   a silicide region located above and contacting remaining portions of said polycrystalline SiGe-containing layer, wherein said silicide region is not located above said facet region and said silicide region does not extend beyond said inner edge of each isolation region.

2. The bipolar transistor of claim 1 wherein said patterned emitter comprises an insulator, doped polysilicon and an knitter diffusion region.

3. The bipolar transistor of claim 1 wherein said SiGe-containing layer is comprised of SiGe or SiGeC.

4. The bipolar transistor of claim 1 wherein said single-crystal SiGe-containing region includes a diffusion region of a first conductivity-type.

5. The bipolar transistor of claim 1 wherein said silicide region is comprised of a refractory metal silicide.

6. The bipolar transistor of claim 5 wherein said refractory metal silicide is titanium silicide.

7. The bipolar transistor of claim 1 wherein said isolation regions are trench isolation regions or local oxidation of silicon isolation regions.

8. The bipolar transistor of claim 1 wherein said substrate is composed of a Si-containing semiconductor.

9. The bipolar transistor of claim 1 wherein said Si-containing semiconductor comprises Si, SiGe, Si/Si, Si/SiGe, or a silicon-on-insulator.

10. A bipolar transistor comprising:
- a substrate having a subcollector located atop a surface of the substrate;
- a Si-containing layer present atop said subcollector, said Si-containing layer having isolation regions therein;
- a SiGe-containing layer present atop said Si-containing layer, said SiGe-containing layer comprising a single-crystal SiGe-containing region and abutting polycrystalline SiGe-containing regions;
- a facet region between said single-crystal SiGe-containing region and each polycrystalline SiGe-containing region;
- a patterned emitter located above said SiGe-containing layer; and
- a silicide region located above and contacting portions of said polycrystalline SiGe-containing layer, wherein said silicide region is not located above said facet region, is not in contact with said patterned emitter, and does not extend beyond an inner edge of said isolation regions.

11. The bipolar transistor of claim 10 wherein said patterned emitter comprises an insulator, doped polysilicon and an emitter diffusion region.

12. The bipolar transistor of claim 10 wherein said SiGe-containing layer is comprised of SiGe or SiGeC.

13. The bipolar transistor of claim 10 wherein said single-crystal SiGe-containing region includes a diffusion region of a first conductivity-type.

14. The bipolar transistor of claim 10 wherein said silicide region is comprised of a a refractory metal silicide.

15. The bipolar transistor of claim 14 wherein said refractory metal silicide is titanium silicide.

16. The bipolar transistor of claim 10 wherein said isolation regions are trench isolation regions or local oxidation of silicon isolation regions.

17. The bipolar transistor of claim 10 wherein said substrate is composed of a Si-containing semiconductor.

18. The bipolar transistor of claim 10 wherein said Si-containing semiconductor comprises Si, SiGe, Si/Si, Si/SiGe, or silicon-on-insulators.

* * * * *